(12) United States Patent
Shaw

(10) Patent No.: US 12,255,676 B2
(45) Date of Patent: *Mar. 18, 2025

(54) SIGNAL PROCESSING SYSTEMS AND METHODS

(71) Applicant: SureWave Technology Limited, Sandback (GB)

(72) Inventor: Philip Shaw, Wheelock (GB)

(73) Assignee: SureWave Technology Limited (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/372,468

(22) Filed: Sep. 25, 2023

(65) Prior Publication Data

US 2024/0014838 A1 Jan. 11, 2024

Related U.S. Application Data

(63) Continuation of application No. 17/846,773, filed on Jun. 22, 2022, now Pat. No. 11,804,867, which is a (Continued)

(30) Foreign Application Priority Data

Oct. 3, 2017 (GB) ...................................... 1716120

(51) Int. Cl.
*H04B 1/10* (2006.01)
*G06F 17/14* (2006.01)
(Continued)

(52) U.S. Cl.
CPC ......... *H04B 1/1027* (2013.01); *G06F 17/142* (2013.01); *H03M 1/12* (2013.01);
(Continued)

(58) Field of Classification Search
CPC ................. H04B 1/1027; H04B 15/00; H04B 2001/1045; H04B 2001/1063; H04B 1/12;
(Continued)

(56) References Cited

U.S. PATENT DOCUMENTS 9,014,315 B1 4/2015 Hogerheiden, Jr. et al.
9,184,775 B2 11/2015 Reinhardt
(Continued)

FOREIGN PATENT DOCUMENTS

EP 0651519 A2 5/1995
EP 1267496 A2 12/2002
(Continued)

OTHER PUBLICATIONS

International Search Report corresponding to PCT/GB2018/052822, dated Jan. 7, 2019.

*Primary Examiner* — Vineeta S Panwalkar
(74) *Attorney, Agent, or Firm* — Barnes & Thornburg LLP

(57) ABSTRACT

A noise reduction system for a digital receiver reduces noise in signals received at the digital receiver. The digital receiver includes an input for receiving an analogue signal, analogue signal processing circuitry for processing an analogue signal, and an output for providing the processed signal to a digital signal processor. The noise reduction system is located between the input and the digital receiver input, and includes a first component that outputs results of a noise signal identification and a second component that applies one or more counter-measure to the received analogue signal to produce a modified analogue signal. The modified analogue signal has a reduced level of noise compared to the received analogue signal, wherein the noise reduction system is arranged to assess the effectiveness of the one or more counter-measures applied by the second component to determine whether any further counter-measures are required.

18 Claims, 10 Drawing Sheets

Related U.S. Application Data continuation of application No. 16/840,140, filed on Apr. 3, 2020, now Pat. No. 11,621,735, which is a continuation-in-part of application No. PCT/GB2018/052822, filed on Oct. 3, 2018.

(51) Int. Cl.
| | |
|---|---|
| *H03M 1/12* | (2006.01) |
| *H04B 15/00* | (2006.01) |
| *H04W 88/14* | (2009.01) |
| *H03L 7/08* | (2006.01) |

(52) U.S. Cl.
CPC ............ *H04B 15/00* (2013.01); *H04W 88/14* (2013.01); *H03L 7/0802* (2013.01); *H04B 2001/1045* (2013.01); *H04B 2001/1063* (2013.01)

(58) Field of Classification Search
CPC ....... G06F 17/142; H03M 1/12; H04W 88/14; H03L 7/0802
See application file for complete search history.

(56) References Cited

U.S. PATENT DOCUMENTS

| | | |
|---|---|---|
| 2002/0093908 A1 | 7/2002 | Yeap |
| 2007/0281620 A1 | 12/2007 | Rubin et al. |
| 2017/0111069 A1 | 4/2017 | Dafesh et al. |
| 2018/0131397 A1 | 5/2018 | Emadi et al. |
| 2020/0244294 A1 | 7/2020 | Itkin et al. |

FOREIGN PATENT DOCUMENTS

| | | |
|---|---|---|
| EP | 2495898 A1 | 9/2012 |
| EP | 2197119 B1 | 2/2013 |
| EP | 2930854 A1 | 10/2015 |

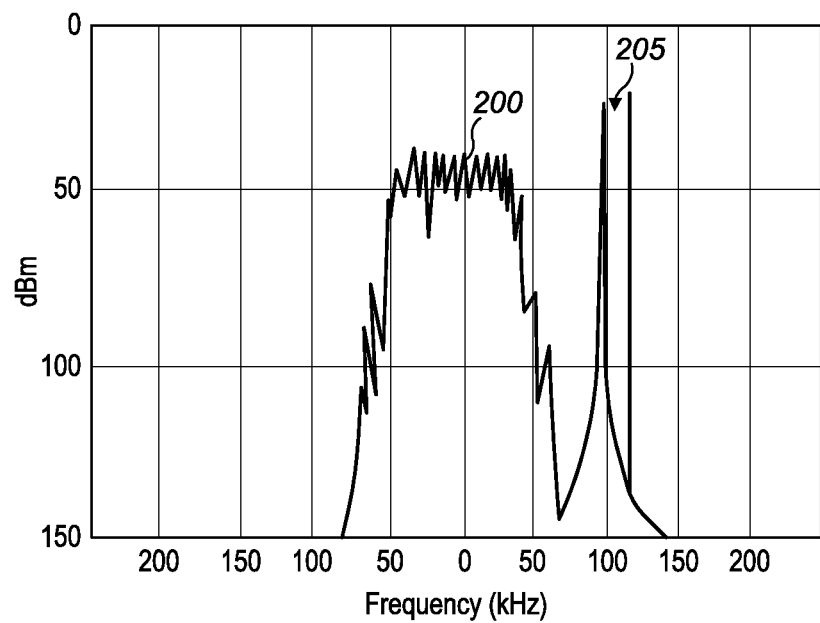
FIG. 8A
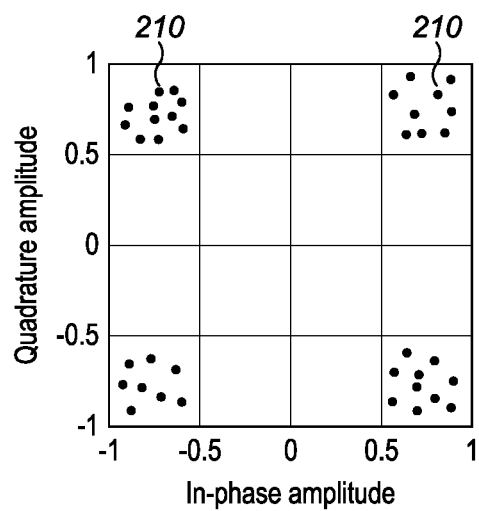 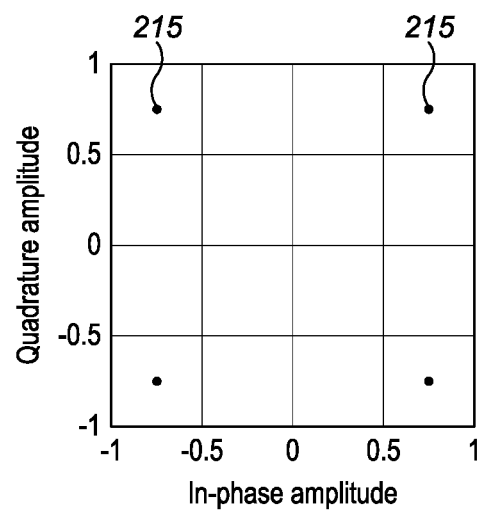
FIG. 8B               FIG. 8C

SIGNAL PROCESSING SYSTEMS AND METHODS

CROSS REFERENCE AND PRIORITY CLAIM

This patent application is a Continuation of U.S. application Ser. No. 17/846,773 filed Jun. 22, 2022, which is a Continuation of U.S. application Ser. No. 16/840,140 filed Apr. 3, 2020, now U.S. Pat. No. 11,621,735, which is a Continuation-in-Part Application claiming priority to International Patent Application No. PCT/GB2018/052822 filed Oct. 3, 2018, which claims priority to Great Britain Patent Application No. 1716120.9. As such, this patent application incorporates the disclosure of PCT/GB2018/052822 by reference in its entirety.

TECHNICAL FIELD

Disclosed embodiments relate to signal processing systems and methods. Particular disclosed embodiments relate to a system for processing signals, and particularly but not exclusively to a noise reduction system for reducing noise in a digital receiver. Aspects of the disclosed embodiments also relate to a method for reducing noise.

BACKGROUND

The reception of electronic signals is now a part of our everyday life, and we have become highly reliant upon having good reception and decoding of data transmitted or sent through cables. The use of such electronic signals ranges from the prevalent use of mobile phones and other mobile electronic devices; to the use of Wi-Fi at home, in the office or in public areas; to broadband connections via cables and satellite communications; as well as a whole host of unseen control signals for automation. An example of a control system may be found within driverless vehicles which require reliable data connections to their remote-control systems.

Unfortunately, users frequently experience difficulties when using their electronic devices, as the reception of a good signal capable of supporting specific functionality is easily affected by various issues which result in either a loss of signal or at least significantly reduced bandwidth. In particular, bandwidth can significantly reduce when the system in question encounters errors when decoding weak signals (also referred to as bit rate errors). When such bit rate errors become too large, the system may restrict the services available to that application or user in order to preserve capacity for other users.

SUMMARY

According to an aspect of disclosed embodiments, there is provided a noise reduction system for a digital receiver for reducing noise in signals received at the digital receiver. The digital receiver comprises an input (digital receiver input) for receiving an analogue signal, analogue signal processing circuitry for processing an analogue signal, and an output for providing the processed signal to a digital signal processor. It is noted that the analogue signal processing circuitry may comprise an analogue to digital conversion such that the processed signal provided to the digital signal processor comprises a digital signal. Alternatively the digital signal processor may be arranged to perform an analogue to digital conversion of the processed (analogue) signal output by the analogue processing circuitry.

BRIEF DESCRIPTION OF THE DRAWINGS

Disclosed embodiments will now be described, by way of example only, with reference to the accompanying drawings, in which:

FIGS. 8A-8C show a series of diagrams illustrating the effects on an electronic signal when noise reduction is carried out by the noise reduction system of FIG. 2;

DETAILED DESCRIPTION

Figure 1:
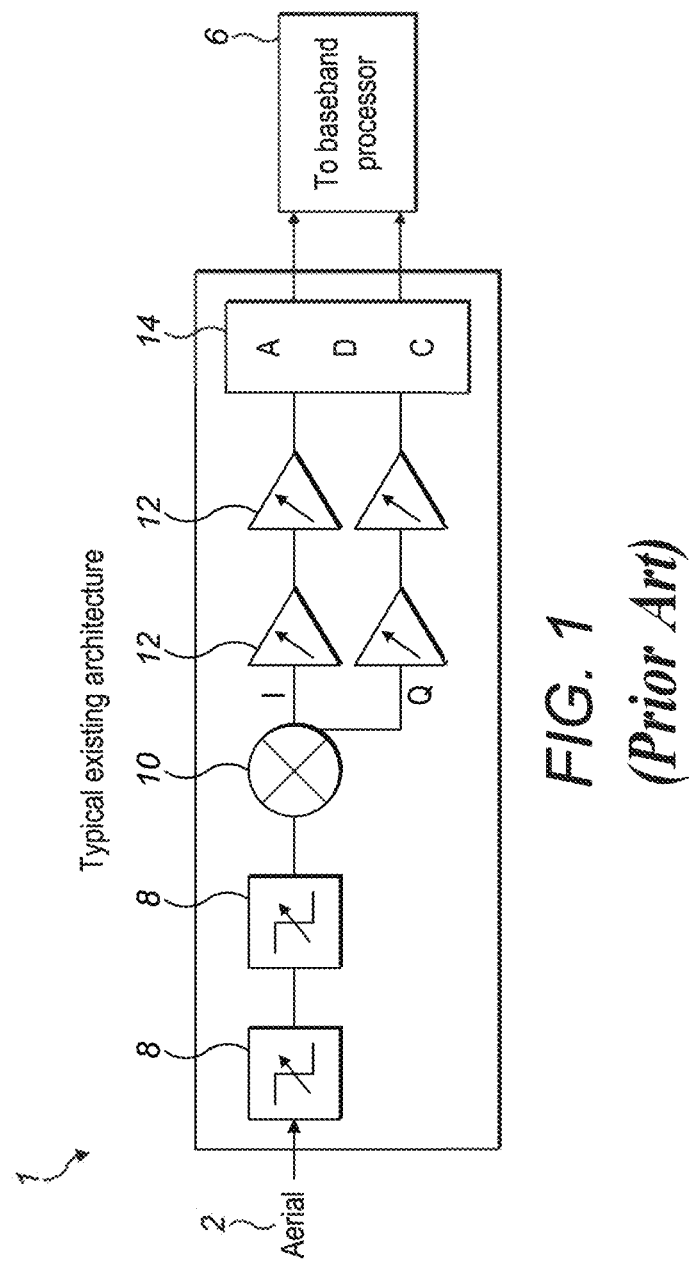
FIG. 1 is a block diagram of a typical digital receiver utilised for processing electronic signals in a mobile phone handset.

Large bit rate errors tend to occur when the signal-to-noise ratio (SNR) of the incoming electronic signals is low due to the presence of interfering noise signals within or adjacent to the signal band or channel of the wanted signal (i.e. the modulated signal containing the data to be decoded). Such in-band or near-band interfering noise signals can originate from a variety of sources, both man-made and environmental; the noise signals can also originate from sources with similar applications.

For example, when considering mobile phone signal reception, interfering signals may originate in other mobile handsets, mobile phone masts, other radio or non-radio interference sources, or simply from static or electromagnetic interference from other electrical apparatus. Considering other application areas of electronic signals, interfering signals can be created as a result of planet-wide interference or space atmospherics. Cable signals may suffer from electrical noise signals and reflected standing waves from poorly balanced signals, and signal interference may penetrate the cable to produce electrical noise signals on the conductor carrying the wanted signal. In addition, over long distances, both radio and cable signals will attenuate and eventually become too weak to be received above the noise at the aerial and the internal electronic noise of the amplifiers and radio receiver circuits where the signal is eventually received and decoded.

Disclosed embodiments have been devised to mitigate or overcome at least some of the above-mentioned problems.

The noise reduction system is configured to reduce noise in the received analogue signal after receipt of the analogue signal at the digital receiver input and before the received analogue signal enters the digital signal processor. The noise reduction system comprises a first component and a second component. The first component comprises an input (first component input) arranged to receive the analogue signal; a processor arranged to assess the received analogue signal and to identify one or more noise signals within the received analogue signal; and an output arranged to output the results of the noise signal identification. The second component comprises an input (second component input) arranged to receive the results of the noise signal identification; and electronic circuitry arranged, in dependence on the results of the noise signal identification, to apply one or more counter-measures to the received analogue signal to produce a modified analogue signal, the modified analogue signal having a reduced level of noise compared to the received analogue signal. The noise reduction system is also arranged to assess the effectiveness of the one or more counter-measures applied by the second component to determine whether any further counter-measures are required. It is noted that various elements may carry out this effectiveness assessment, depending on the desired configuration of the overall system: for example, the (baseband/control) processor would be capable of providing this functionality. Alternatively, the processor of the first component in the noise reduction system, or even a dedicated third component with its own processor, could carry out the effectiveness assessment.

The digital signal processor may comprise any processor arranged to process digital signals, e.g. a baseband processor or baseband chip or a modem. The second component may apply one or more countermeasures by generating one or more countermeasures in the electronic circuitry of the second component and then outputting (via a mixer component within the electronic circuitry) the generated countermeasures such that they are mixed with the received analogue signal to produce a modified analogue signal that has a reduced level of noise compared to the received analogue signal. The modified analogue signal may then be sent to the analogue signal processing circuitry and subsequently the digital signal processor.

Advantageously, the above-described noise reduction system ensures that the interfering noise signal is removed/reduced before it can even enter the digital receiver's circuits and this therefore directly improves the SNR of the received signal, and removes the errors during subsequent decoding. This enables much higher data rates and hence a given communications channel or cable can support higher bandwidths over much greater distances, resulting in improved signal reception to a particular device. A feedback loop is also provided by the components of the noise reduction system, thereby enabling the system to determine the success of a particular counter-measure, and whether additional or alternative counter-measures may be required. The above-described noise reduction system is therefore self-assessing and can determine whether the interfering noise signals have been removed, or at least sufficiently suppressed so as to enable subsequent processing and decoding of the wanted signal to take place.

The noise reduction system according to embodiments may be used to mitigate or reduce the effects of noise signals in a received analogue signal. Noise signals may arise from a variety of sources and also include interfering signals within or adjacent to the signal band or channel of the wanted signal. Noise signals that the noise reduction system may reduce or mitigate may further comprise in-band or near-band interfering noise signals originating from a variety of sources, both man-made and environmental. Noise signals may also originate from sources with similar applications. When considering mobile phone signal reception, interfering signals may originate in other mobile handsets, mobile phone masts, other radio or non-radio interference sources, or simply from static or electromagnetic interference from other electrical apparatus. Considering other application areas of electronic signals, interfering signals may be created as a result of planet-wide interference or space atmospherics. Cable signals may suffer from electrical noise signals and reflected standing waves from poorly balanced signals, and signal interference may penetrate the cable to produce electrical noise signals on the conductor carrying the wanted signal. In addition, over long distances, both radio and cable signals will attenuate and eventually become too weak to be received above the noise at the aerial and the internal electronic noise of the amplifiers and radio receiver circuits where the signal is eventually received and decoded.

The noise reduction system may be configured to receive the analogue signal from the digital receiver input and to apply noise countermeasures before outputting a modified analogue signal (with reduced noise) to the existing analogue signal processing. Alternatively, the noise reduction system may be configured to operate at any point before the analogue signal is sent for digitisation in an ADC. For example, the analogue signal processing circuitry within the digital receiver may, at some point, downmodulate the analogue signal into a(n) (analogue) baseband signal and the noise reduction system may be configured to receive the analogue baseband signal and to produce a modified baseband signal.

In some cases, the processor of the first component may be configured to convert the analogue signal into a digital signal, and to perform a mathematical transformation on the converted digital signal, the mathematical transformation identifying the one or more noise signals and at least one property associated with each identified noise signal.

Converting the incoming analogue signal into a digital signal allows the noise reduction system to act on a digital signal equivalent to the one that will eventually be processed by the digital receiver itself, whilst still ensuring that the incoming signal is intercepted for noise removal prior to entering the analogue signal processing circuitry. The noise reduction system may therefore be able to identify not only the noise interference present in the incoming signal, but also any noise that may be introduced into the signal by the signal processing equipment itself. Furthermore, the use of a mathematical transformation by the processor when identifying the noise signals enables each signal to be identified easily, together with any associated properties that characterise the noise and may help to determine the most appropriate counter-measure to be used by the electronic circuitry of the second component to remove each individual signal.

Optionally, the mathematical transformation comprises a Fast Fourier Transform. Advantageously, the use of a Fast Fourier Transform (FFT) is a very efficient method of characterising an incoming signal as it ensures that each of the noise signals (together with various characterising properties of each signal) may be identified within a very short period of time (i.e. only a few instruction cycles, and possible up to a minimum of a few picoseconds). This is particularly useful as it ensures that interfering signals can be identified, assessed and removed as quickly as possible, thereby allowing the noise reduction system to be adaptable and reactive to variations in the interfering noise signals.

Optionally, the at least one property associated with each identified noise signal is selected from the following group: central frequency of the signal, signal amplitude, signal width, and signal modulation. Advantageously, characterising a particular noise signal based on its central frequency, and optionally also its amplitude, allows the exact location of the noise signal in the frequency band of interest containing the wanted signal (also referred to as the 'passband') and its size relative to the wanted signal to be determined. Identifying these properties makes it easier for the noise reduction system to accurately configure any signal processing equipment to remove the noise signal as accurately as possible, without unduly affecting the wanted signal.

In some cases, the first component is arranged to output the results of the mathematical transformation via an output to an input of the second component.

Advantageously, this enables the electronic circuitry of the second component to determine the most appropriate counter measures that are to be taken, and (if appropriate) to control its internal signal processing equipment to carry out the chosen counter measures. Alternatively, it is envisaged that the results of the mathematical transformation are retained by the first component, and instead control signals are provided to the second component by the processor of the first component, on the basis of these results, which instruct the electronic circuitry of the second component to take appropriate counter measures.

In some instances, the processor of the first component may be configured to generate a digital matrix based on the results of the mathematical transformation. Advantageously, a digital matrix provides a means of characterising and storing identifying properties of each noise signal using a minimum of storage space, and is therefore easy to create, to transmit between components and to store (where appropriate).

Optionally, the processor of the first component may be arranged to extract each of the one or more identified noise signals from the incoming/received analogue signal, and to output the extracted analogue noise signals to the second component.

These noise signals may then be used by the noise reduction system (and particularly the electronic circuitry of the second component) to more accurately remove the sources of noise, as some counter-measures may require signal processing to be carried out upon the original analogue noise signal itself. This is particularly the case for signals with complex profiles that cannot necessarily be characterised with sufficient accuracy based solely on properties such as central frequency and amplitude.

In some cases, one of the counter-measures applied by the electronic circuitry of the second component comprises configuring and applying a filter to the incoming analogue signal to remove one of the identified noise signals. In addition, where a mathematical transformation is performed by the processor of the first component to identify the signals and at least one of their properties, the applied filter may be configured using the at least one property.

Advantageously, the use of a pre-configured filter provides a simple and easy way to remove a noise signal, as it minimises the amount of signal processing that is required to be carried out. This is particularly the case when the identified noise signal is narrow-band, as narrow 'notch' filters may be dynamically customised and configured using the properties of a noise signal (for example, the notch filter may be defined to be centred on and applied at the central frequency of the noise signal), so as to ensure that each noise signal be accurately removed without unduly affecting the wanted signal. It is noted that in some cases, the centre frequency of the notch filter may be moved slightly to avoid any accidental distortion of the wanted signal, and therefore may not necessarily coincide exactly with the centre frequency of the interfering signal that is to be removed. However, such offsets should not result in a detrimental effect on the efficacy of the noise removal.

In some instances, the electronic circuitry of the second component is configured to generate a replica noise signal corresponding to one of the identified noise signals. The electronic circuitry of the second component may also adjust the replica noise signal so that it is substantially in anti-phase with the identified noise signal, and then mix the adjusted replica noise signal with the incoming analogue signal.

In cases where the identified noise signals will not be so easily removed using a simple notch filter (for example, in the case of wide-band noise), a simple method of removing such noise signals may be to generate a replica signal, using the electronic circuitry of the second component, that mimics the properties and profile of each identified noise signal. This replica signal may then be inverted and phase-adjusted, such that it is in anti-phase with the corresponding noise signal. Mixing this processed/adjusted replica signal with the incoming analogue signal should ensure that substantially all of the noise signal in question is cancelled out, or at least reduced to an acceptable level within the modified analogue signal.

Optionally, the replica noise signal may be generated, using the electronic circuitry of the second component, based on the generation of a tonal signal. Additionally or alternatively, the replica noise signal may be generated based on the extracted noise signals received from the first component.

Where the identified noise signal corresponds to a fairly simple signal, the noise reduction system (and specifically the electronic circuitry of the second component) may generate a tonal (or sine-wave) signal, usually of the same frequency as that associated with the identified noise signal, to form the basis of the replica noise signal. This method is useful as it merely requires relatively simple, standard signal processing equipment, in combination with knowledge of one or more key properties of the noise signal in question. Alternatively or additionally, where the identified noise signal is more complex and cannot be represented accurately by a simple tonal signal, the electronic circuitry of the second component may use the actual noise signals extracted from the incoming analogue signal by the processor of the first component, to form the basis of the generated replica noise signal.

In some scenarios, the processor of the first component may be arranged to generate and output a control signal to the input of the second component to control the counter-measures that are applied by the electronic circuitry of the second component. This is useful as the first component carried out the identification of the noise signals, and therefore it would be efficient for the first component to also be able to specify how the electronic circuitry of the second component is to remove/reduce the noise signals.

In some cases, the processor of the first component may be arranged to assess the effectiveness of the one or more counter-measures applied by the electronic circuitry of the second component. Alternatively, the processor of the first component may be arranged to output a control signal to a third component to control an effectiveness assessment which is carried out by (a processor of) the third component.

Optionally, at least one of the first and second components is arranged to be controlled via output of a control signal from the digital signal processor to the respective component. If applicable, the third component may also be arranged to be controlled via output of a control signal from the digital signal processor to the respective component.

It may be advantageous for the processor of the first component to carry out the assessment of the effectiveness of the noise reduction system, as it is already set up to analyse the incoming analogue signal to identify sources of noise. Alternatively, the processor of the first component may control another (third) component to carry out the assessment on its own. Furthermore, it may be advantageous for the overall functionality of the noise reduction system to be controlled by a single entity or component for simplicity and efficiency, where that single controlling component is provided with the majority of the processing and storage capability, and the other components effectively function as subsidiaries and receive control signals from the controlling component to carry out their individual functions. In some cases, the controlling component may correspond to the (processor of the) first component, or to a separate processor, such as the digital signal processor of the digital receiver, which is already incorporated within the digital receiver.

In some instances, the third component may be arranged, once the electronic circuitry of the second component has applied the one or more counter-measures to the incoming analogue signal to form the modified signal, to assess the modified analogue signal using a processor, and to identify one or more residual noise signals in the modified analogue signal.

By effectively diverting or 'tapping off' a portion of the analogue signal for assessment, the third component is able to identify any residual noise signals that still remain within the analogue signal, the presence of which would indicate that the counter-measures applied by the second component were not (entirely) successful. The third component therefore provides a means of assessing the performance of the noise reduction system substantially in real-time to determine whether any additional or alternative counter-measures need to be carried out; or whether the counter-measures have reduced the noise to an acceptable level for signal decoding to be carried out successfully.

Specifically, a processor of the third component may be arranged to carry out a mathematical transformation of the modified analogue signal (i.e. the received analogue signal after the one or more counter-measures have been applied by the electronic circuitry of the second component), for comparison with the mathematical transformation carried out by the processor of the first component on the received analogue signal. This will enable a direct 'before' and 'after' comparison to be made, and will allow the characterising properties of the residual noise to be determined. This will, in turn, influence the subsequent counter-measures that are applied by the electronic circuitry of the second component.

It will be appreciated that the processor of the first component may carry out the effectiveness assessment in the above-described manner, in which case, no dedicated third component would be required, and all of the features described above would apply equally to the first component.

In some cases, the digital receiver comprises or corresponds to a digital receiver in a mobile device. In this case, the input comprises a mobile device aerial and the digital signal processor comprises a baseband processor of the mobile device.

Where the above-described noise reduction system is implemented in the context of a mobile device (for example a mobile phone), it can advantageously increase the signal strength perceived by the mobile device digital receiver due to a reduction in bit rate errors. In turn, this may also extend the battery life of the mobile device, since the power to the RF sections of the mobile device can be reduced as the received signal strength increases.

The incoming/received analogue signal may comprise any one of the following: mobile network signals, radio signals, Wi-Fi signals, satellite communications, broadband connections. The applications of the present noise reduction system are diverse, and can be used to increase signal strength and coverage over a variety of different technological fields. For example, it is envisioned that the system described above (or the method that is described below) could be implemented in a radio receiver which is arranged to receive a signal containing interference, so as to attenuate, reduce or remove the interference in the signal.

According to another aspect of disclosed embodiments, there is provided a noise reduction method for reducing noise in signals received at a digital receiver, the digital receiver comprising an input (digital receiver input) for receiving an analogue signal, analogue signal processing circuitry for processing an analogue signal, and an output for providing the processed signal to a digital signal processor, wherein the method comprises: assessing, by a processor of a first component located between the input and the analogue signal processing circuitry, the received analogue signal and identifying one or more noise signals within the analogue signal; applying, by electronic circuitry of a second component located between the input and the analogue signal processing circuitry, one or more counter-measures to the received analogue signal in dependence on the identified noise signals in order to produce a modified analogue signal, the modified analogue signal having a reduced level of noise compared to the received analogue signal; and assessing the effectiveness of the one or more applied counter-measures to determine whether any further counter-measures are required.

According to another aspect of disclosed embodiments, there is provided a computer program product comprising instructions which, when the program is executed by a computer, cause the computer to carry out the steps of the above-described method.

According to a further aspect of disclosed embodiments, there is provided a computer-readable storage medium comprising instructions which, when executed by a computer, cause the computer to carry out the steps of the above-described method.

According to a further aspect of disclosed embodiments, there is provided a mobile device comprising a noise reduction system, or carrying out the noise reduction method, as described above. This mobile device may comprise a mobile phone or other similar device. Alternatively, a WiFi router or similar device may be provided comprising the noise reduction system or carrying out the noise reduction method discussed above.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

Although the majority of this specification focuses on the implementation of a noise reduction system in a typical mobile phone handset, it should be understood that possible applications of such a system cover various other forms of devices, and also involve a wide range of technologies and fields. As long as signal transmission and reception occurs in a system, regardless of the medium, the noise reduction system described herein will be of benefit. For example, the noise reduction system may be used in the context of mobile networks, radio communications, Wi-Fi, satellite communications, or even broadband cable connections (either copper cable or fibre optic cables).

In order to place the invention in context, a description will now be provided of the existing digital receiver architecture that is provided within a typical mobile phone for converting incoming analogue signals into digital signals that are subsequently processed and decoded. It will be appreciated however, that such a mobile phone digital receiver system and how it works will be known to the skilled person, and therefore only a very brief summary will be provided here.

FIG. 1 illustrates the configuration and components of a typical mobile phone or other equivalent mobile device, which commonly employs software-defined radio (SDR) techniques. The mobile device comprises an aerial or antenna 2 for receiving the incoming analogue signals, and analogue signal processing circuitry 4 for carrying out initial signal processing of the incoming analogue signal into an analogue baseband signal that can then be converted into a digital signal. The analogue signal processing circuitry can be seen to operate on the received modulated analogue signal to retrieve the modulated portion of the received analogue signal in the form of an analogue baseband signal.

The mobile device also comprises a processor 6 (generally referred to as a digital baseband processor) which carries out further processing and decoding of the resultant digital signal. In greater detail, the incoming signal creates a voltage on the aerial 2 which is passed through several bandpass filters 8 and amplifiers (not shown) within the analogue signal processing circuitry 4, and then is mixed using a mixer 10 to produce I and Q signals at the baseband frequency. These analogue baseband signals are then passed through further filters and amplifiers 12 before being digitized by ADC (Analogue-digital-converter) functions 14; the resultant digital signal is then passed to the digital baseband processor 6 for decoding. In the illustrated case, it is noted that the analogue signal processing circuitry 4 is configured to carry out the conversion of the incoming analogue signal into a digital signal. However, it should be appreciated that this may not always be the case, and that in some cases, only a subset of analogue signal processing may be carried out by the analogue signal processing circuitry 4, with the analogue-to-digital conversion process instead being performed by another component subsequently, for example by the baseband processor 6.

The amplifiers 12, regardless of whether they are hardware- or software-controlled, are configured to try to ensure that the wanted signal amplification is near to the available full scale of the system, so as to achieve maximum SNR. However, if signals from other sources are present within the bandwidth of the wanted signal, then the amplification is restricted to ensure that these amplified noise signals do not exceed the system's capabilities or full scale. Such a situation may be referred to as overload. From tests performed on typical 4G LTE Mobile receivers, it is noted that the wanted signal suffers significant degradation due to these adjacent signals, which is of course, undesirable.

Figure 2:
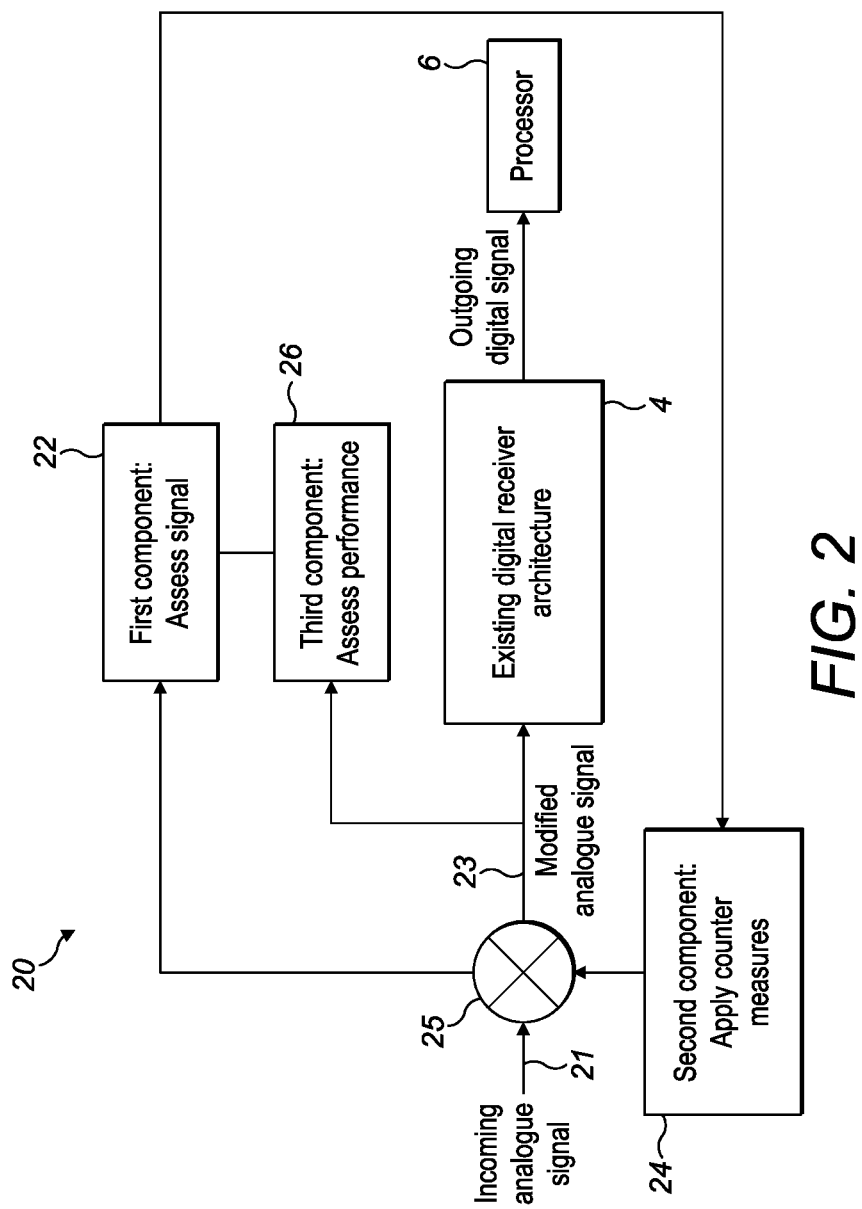
FIG. 2 is a schematic block diagram showing components of a noise reduction system for reducing noise in a digital receiver, according to a disclosed embodiment.

FIG. 2 provides a high-level illustration of a noise reduction system 20, according to a disclosed embodiment, that may be incorporated into existing mobile phone systems.

The noise reduction system 20 of this embodiment is integrated into the existing mobile phone system architecture, and is designed to act on the incoming analogue signals 21 before they are processed by the analogue signal processing circuitry 4 and then converted into digital signals.

The noise reduction system 20 comprises three components or functional blocks which each carry out a different type of task. A first 'signal assessment' component 22 is configured to analyse or assess the received analogue signal 21 and to identify the various sources of noise present within the received signal; and a second 'counter-measure application' component 24 is configured to use various electronic circuitry elements (for example, filters, mixers, amplifiers, switches etc.) to take one or more of a plurality of counter-measures in order to reduce or eliminate the identified sources of noise. This may involve incorporating additional signals into the incoming analogue signal via a mixer 25 such that a "modified analogue signal" 23 is passed to the analogue processing circuitry 4. A third 'performance assessment' component 26 is configured to assess the performance of the noise reduction system 20 by analysing the modified analogue signal 23 (in other words analysing the received analogue signal after it has been acted upon by the second component 24), and identifying sources of noise still present within the analogue signal in order to ascertain whether any further or additional counter-measures need to be taken by the second component 24.

In addition to carrying out the initial noise level assessment of the incoming signal, in this embodiment, the first component 22 is also arranged to have overall control over the functioning of the noise reduction system 20 as a whole. In particular, the first component 22 is arranged to control the types of counter-measures that are taken by the second component 24, as well as to control the manner in which the third component 26 assesses the overall noise reduction system 20 performance. However, it will be appreciated that this setup is merely one of several possible configurations—for example, other components such as the baseband processor 6 may have control over all or part of the noise reduction system 20.

As a result of its location within the existing mobile phone system architecture and configuration, the noise reduction system 20 is able to remove or mitigate the interfering noise signals from the incoming signal before it enters the analogue signal processing circuitry 4. This directly improves the SNR of the analogue signal that is processed and digitised, and removes or reduces errors in the subsequent decoding of the digital signals. This enables much higher data rates to be achieved (due to the reduction in errors) and hence a given communications channel can support higher bandwidths over much greater distances.

It is noted that the received analogue signal is a signal that comprises the wanted signal (i.e. the modulated analogue signal that contains the data to be decoded) and noisy/interfering signals. It can be seen therefore that the noise reduction system according to disclosed embodiments operates to receive the incoming analogue signal and then to reduce or mitigate the effects of noise within the received analogue signal in order to output a modified analogue signal that comprises the wanted signal and fewer noisy/interfering signals (compared to the received analogue signal). This modified analogue signal is then passed to the analogue processing circuitry which operates as described in relation to FIG. 1 to retrieve the modulated portion of the modified analogue signal in the form of an analogue baseband signal.

Figure 3:
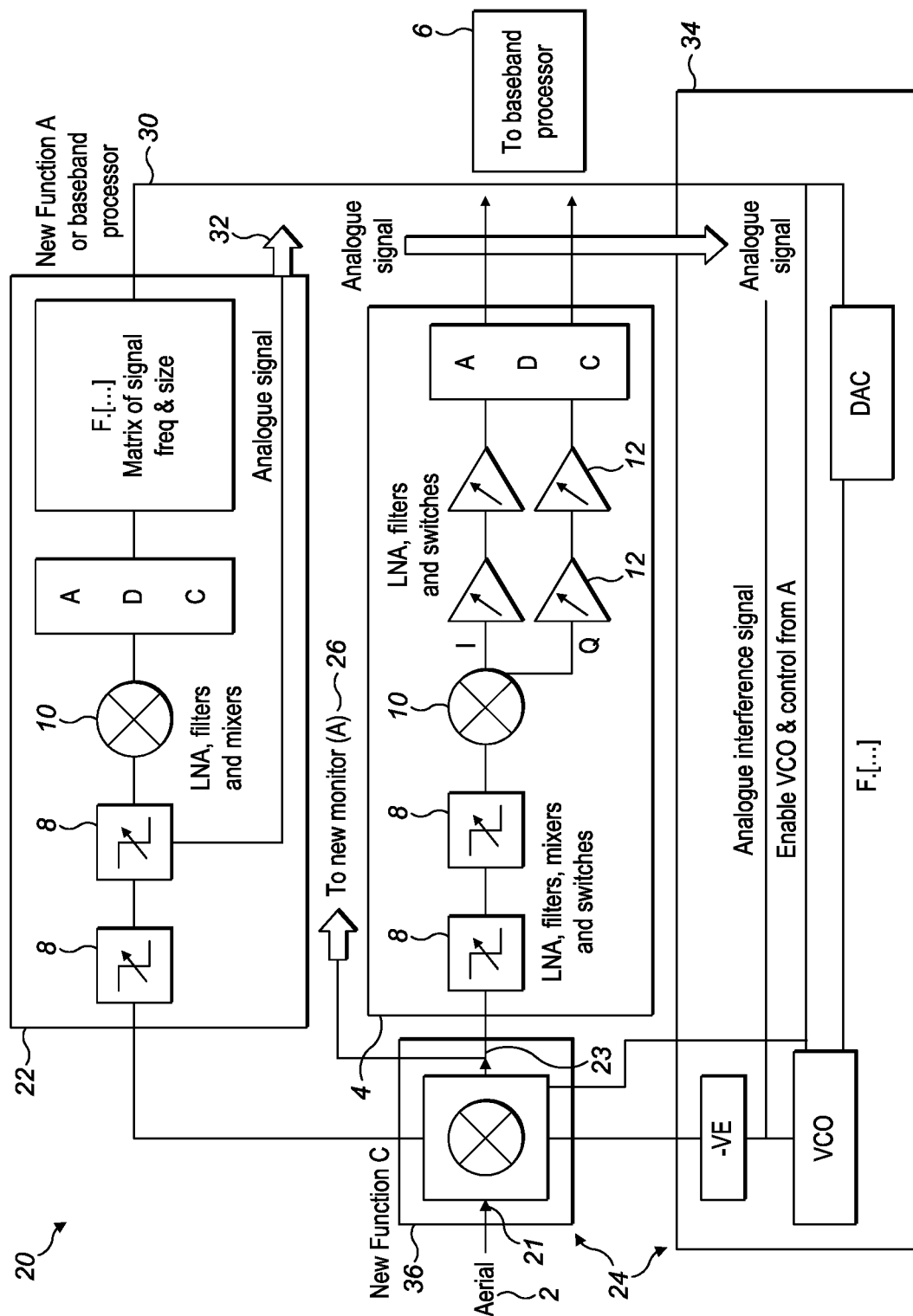
FIG. 3 is a schematic block diagram showing a more detailed illustration of the components of the noise reduction system of FIG. 2, where the noise reduction system is incorporated into a typical mobile phone system architecture.

FIG. 3 shows in greater detail the configuration of the noise reduction system 20 that was broadly described in FIG. 2. In particular, FIG. 3 shows the location of the various components of the noise reduction system relative to the existing receiver architecture (as shown in FIG. 1) and the existing signal processing paths.

The first 'signal assessment' component 22 of the noise reduction system 20 is arranged and functions effectively parallel to the analogue signal processing circuitry 4 in terms of signal processing. In other words, the first component 22 (which is also referred to as Function A in the figure) is arranged to also receive the incoming analogue signal 21 from the aerial 2 and to process and digitise (if applicable) this analogue signal in a similar manner as the existing analogue signal processing circuitry 4. The first component 22 is configured to provide two outputs 30, 32 to the second component 24 in order to allow various noise reduction counter-measures to be taken subsequently—a first output 30 comprising information characterising each source of noise identified by the first component 22 to be present within the signal; and a second output 32 comprising the actual identified noise signals.

In the illustrated embodiment, the second 'counter-measure application' component 24 of the noise reduction system 20 actually comprises two sub-components 34, 36 (labelled in the figure as Functions B and C), which are arranged to apply various noise reduction/removal counter-measures to the incoming analogue signal (using the various electronic circuitry elements incorporated in each sub-component) such that a modified analogue signal 23 enters the analogue signal processing circuitry 4. Specific examples of such counter-measures will be discussed subsequently with reference to FIGS. 5 and 6, however in general, there are two different categories of counter-measures that are usually applied, depending on the properties of the noise signal—typically wide-band and narrow-band noise signals will require different treatment. One category of counter-measures involves the active filtering and removal of signals (usually very narrow-band signals), whilst the other category involves the generation of replica noise signals which are then inverted and mixed into the incoming analogue signal. This latter method has the effect of 'cancelling out' the noise signals in the incoming analogue signal before the signal reaches the analogue signal processing circuitry 4.

It will be appreciated that although two separate sub-components 34, 36 are shown in this figure, their functionality could be incorporated into a single component—i.e. Functions B and C could be combined into a single functional block if so desired.

It is noted that in FIG. 3, the first component 22 is shown as being configured to control the second component 24—connections between Function A and Functions B and C are shown in the figure. As mentioned previously however, these connections need not necessarily be in place for the system 20 to function. Alternative embodiments are envisioned in which the main controlling entity is the baseband processor 6, or another separate processing component.

Finally, the third 'performance assessment' component 26 of the noise reduction system 20 (which is labelled as new Monitor (A) in the figure) is arranged to receive the modified analogue signal before it enters the analogue signal processing circuitry 4, but after the output from the second component 24 (i.e. after the appropriate counter-measures have been applied to the incoming analogue signal). The third component 26 is therefore able to directly evaluate the performance of the noise reduction system and provide feedback on the success of the various counter-measures that have been applied.

It will be appreciated that due to its similarity to the first component 22, the third component 26 may be a subsidiary of the first component 22, and/or directly controlled by the first component 22. Alternatively, the third component 26 may be incorporated into the existing mobile phone system architecture and its functionality may instead be carried out by the baseband processor 6.

Figure 4:
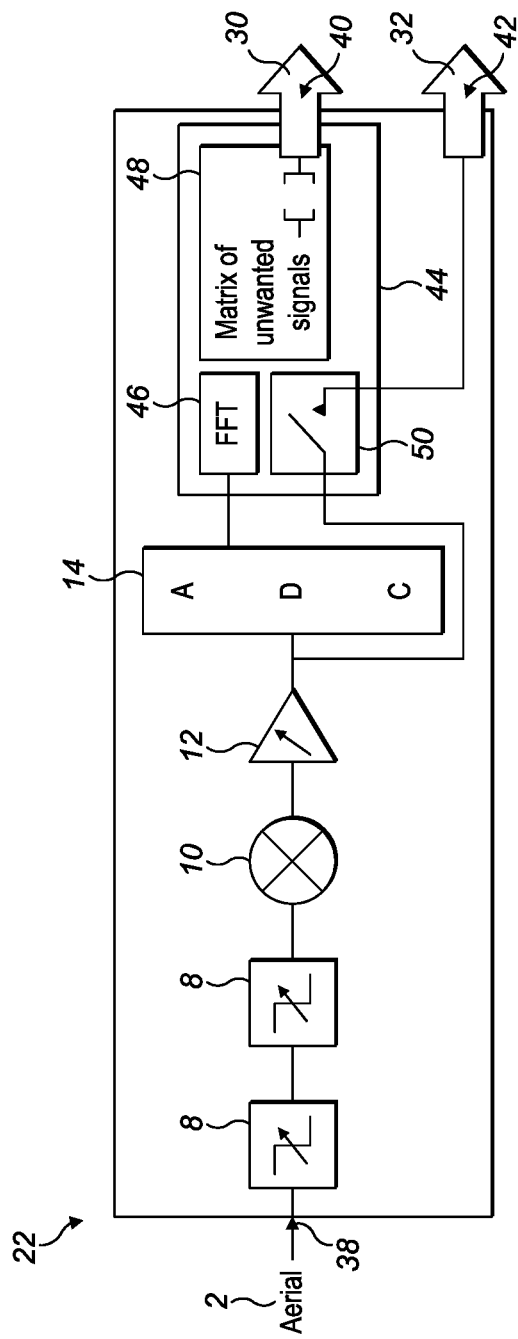
FIG. 4 is a schematic block diagram showing further details of a first component of the noise reduction system of FIG. 2 for assessing the incoming signal and identifying sources of noise.
Figure 5:
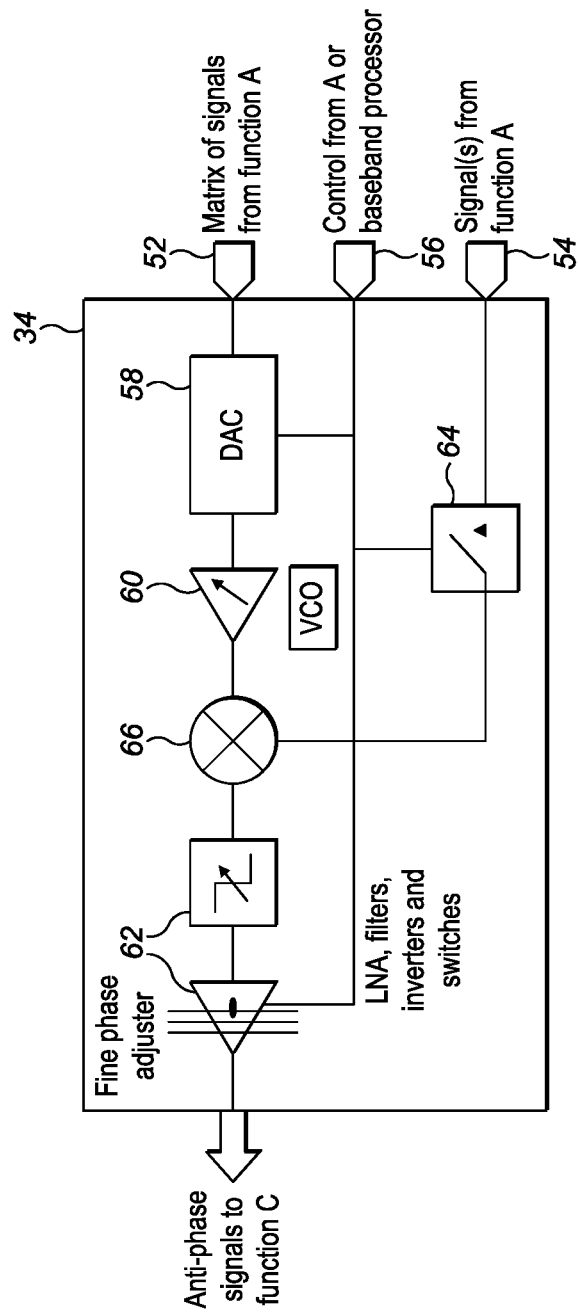
FIG. 5 is a schematic block diagram showing a first portion of a second component of the noise reduction system of FIG. 2 for applying counter-measures to remove the identified noise in the received signal.
Figure 6:
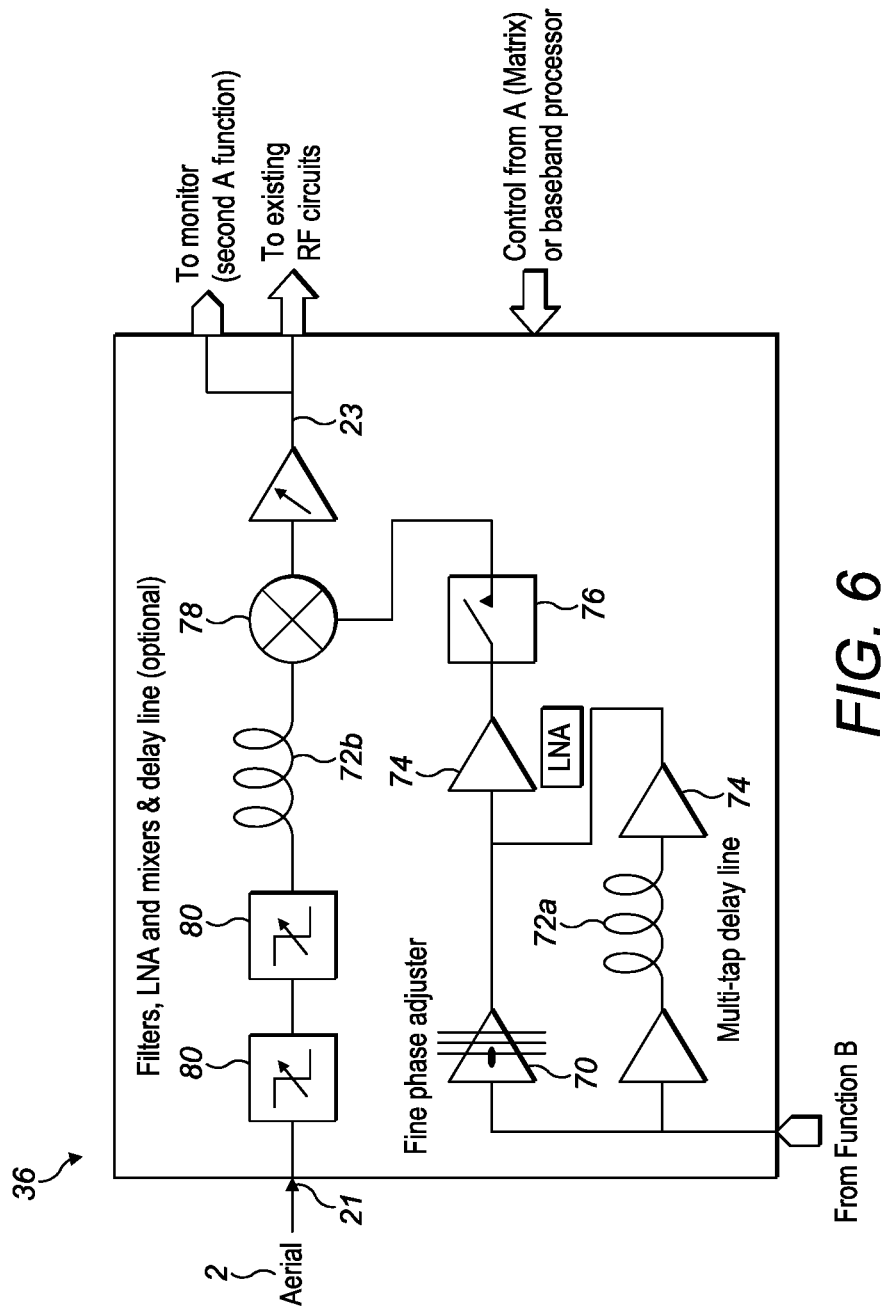
FIG. 6 is a schematic block diagram showing a second portion of the second component of the noise reduction system of FIG. 2.

A more detailed description of each of the three components will now be provided with reference to FIGS. 4 to 6.

FIG. 4 shows a schematic diagram of the first component 22, for assessing the incoming analogue signal 21 and identifying sources of noise (and therefore also referred to interchangeably herein as the 'signal assessment' component), from which it can be seen that the pre-processing and analogue-to-digital conversion (ADC) functionality of the analogue signal processing circuitry is effectively replicated within the first component.

In particular, the first component 22 comprises an input 38 for receiving the incoming analogue signal from the aerial 2; as well as a set of pre-processing equipment—namely, a series of bandpass filters 8, amplifiers 12 (for example, LNAs, or Low Noise Amplifiers) and mixers 10—which replicates the existing analogue signal processing circuitry 4. It will be appreciated that the pre-processing equipment provided in the first component 22 may be optional, as instead of selecting a specific (desired) frequency band containing the wanted signal, the first component 22 could instead operate on, and forward to the second component 24, the entire received analogue signal. The first component 22 also comprises an ADC function 14 (Analogue-to-Digital Converter) similar to that provided in the existing analogue signal processing circuitry 4 for generating a digital signal. The first component 22 is therefore able to perform simple band filtering and obtain a similar pre-processed analogue signal to that which is produced in the existing mobile phone analogue signal processing circuitry 4. The first component 22 also comprises a pair of outputs 40, 42 for providing data and signals to the other components 24, 26 in the noise reduction system 20, as well as a processor 44 for controlling the noise characterisation processes, and for handling interactions with the other components 24, 26 in the noise reduction system 20.

The processor 44 of the first component 22 is programmed with instructions to assess the digital signal generated by the ADC 14 and to identify the interfering noise signals that are present in the digital signal. In particular, the processor 44 is configured to carry out a Fast Fourier Transform (Fast FFT) 46 on the digital signal in order to identify each individual component that is present within the received signal (i.e. both wanted signal as well as the various interfering noise signals), and to determine various properties associated with each signal component. A digital matrix 48 is output via the first output 40 as a result of the FFT 46 which contains, for each identified interfering noise signal, its central frequency and amplitude with respect to the wanted signal (although other signal properties may also be included). Since the properties of the wanted signal (for example, the central frequency) are known, the wanted signal component may be identified within the FFT results and excluded from the digital matrix. On the basis of this FFT result, the processor 44 is also configured to extract one or more of the identified noise signals 32 from the pre-processed analogue signal (prior to its digitisation by the ADC) if it is deemed appropriate to do so; this signal extraction is achieved via the use of a software-controlled switch 50 and one or more programmable band-pass filters (not shown). The generated digital matrix 48 and the extracted noise signals 32 (if the latter are required) are then output via the second output 42 from the first component 22 to the second component 24 to allow various counter-measures to be applied to the incoming signal.

An advantage of using a Fast Fourier Transform to characterise the noise in the incoming signal is that the process used to compute the Fast FFT 46 takes only a few instruction cycles and can be performed in real-time using the current hardware available in a typical baseband processor 6 of a mobile phone handset, or a dedicated processor or ASIC (Application-specific Integrated circuit). However, it will be appreciated that other mathematical transformations that achieve similar results in comparable time periods could also be used here. For example, various well-known spectrum estimation techniques or methods of estimating power/frequency distribution may be utilised instead of, or in addition to the FFT.

It should also be noted that the extraction of the noise signals may be carried out by either (a) using one or more programmable band pass filters to 'pass out' or extract each noise signal from the analogue signal; or (b) by removing the 'wanted signal' from the analogue signal (using a programmable notch filer) and then subsequently outputting the remaining portions of the signal. It will also be understood that as the first component 22 is carrying out the initial characterisation of the noise in the incoming signal, this component 22 is therefore well-placed to control the subsequent noise removal and performance assessment processes that are carried out by the other two components 24, 26 as the first component 22 will be aware of the actions that need to be taken in order to ensure optimal noise reduction. However, control of the other components 24, 26 in the noise reduction system 20 could instead be carried out in an alternative manner, for example by a separate processor 6 that may be part of the existing mobile phone architecture.

Turning now to the second component 24 of the noise reduction system 20, for applying one or more counter-measures to remove noise from the signal (and therefore also referred to interchangeably herein as the 'counter-measure application' component), it will be appreciated that there are many different sources of noise which results in the identified interfering noise signals having a wide range of properties; certain counter-measures will therefore be particularly effective at reducing or eliminating noise signals with specific properties. Examples of various functional blocks or sub-units that could be incorporated into the second component 24 in order to carry out various counter-measures will now be described with reference to FIGS. 5 and 6.

FIG. 5 illustrates the internal configuration and electronic circuitry of the first sub-component 34 (labelled as Function B in FIG. 3) of the 'counter-measure application' component 24 which is configured to provide the requisite functionality to remove relatively simple noise signals, which are suitable to be inverted and mixed into the incoming analogue signal (to form the modified analogue signal that is passed to the analogue signal processing circuitry 4).

As shown in the figure, the first sub-component 34 comprises two inputs 52, 54 which each correspond to a separate signal processing and generation path; the first sub-component 34 also comprises a third 'control' input 56 whereby control signals from the 'signal assessment' component 22 are received and used to control the signal processing equipment in the first sub-component 34. The first input 52 is arranged to receive the digital matrix 48 of signals from the first component 22, and the signal processing equipment and electronic circuitry provided along the corresponding path comprises a DAC 58 (Digital-to-Analogue Converter) and a VCO 60 (Voltage-Controlled Oscillator). This first signal processing path involves using the received digital matrix 48 to generate a replica of one or more noise signals by using the DAC 58 to produce a voltage to control the VCO 60, which in turn creates a signal of the required frequency (i.e. a signal centred on the frequency corresponding to that of the interfering noise signal in question). This signal is then shaped and phase adjusted using various electronic circuitry elements such as filters, adaptive LMS (Least Mean Square) circuits and LNA RF amplifiers (collectively labelled as 62) to produce a substantially equivalent adjusted replica of the interfering signal. Signals that may be usefully replicated by this technique are those which are relatively simple—for example simple noise spikes, as well as simple single tones or predominantly tonal interfering signals.

The second input 54 and signal processing path is arranged to receive and transmit the noise signals 32 that were extracted from the incoming analogue signal by the first component 22. This second signal processing path is generally utilised for those noise signals which have more complex profiles and would therefore be much more difficult to replicate using the first signal processing path described previously, for example general background noise levels in the signal may require utilisation of the counter-measure provided by the second signal processing path. It will be appreciated that depending on the level of noise present in the original incoming analogue signal, as well as the types of noise that are present, this second path need not always be utilised. For example, if only simple easily-replicable signals are present in the incoming analogue signal, then this second path will not be required. The optional nature of this second path is represented in the figure by a switch 64, which may be controlled by the first component 22 to 'open' the second path if appropriate, for example if it is determined (by the third component 26) that the background or overall level of noise in the incoming signal is still not at a sufficiently low level.

The first sub-component 34 also comprises a mixer 66 to combine the replica noise signals that are generated along the first signal processing path, with the analogue signals received from the first component 22 that are transmitted along the second signal processing path, into a single signal. The resultant combined replica signal is subsequently acted upon by the various inverters and phase adjusters 62 which 'shape' the combined replica signal into an adjusted replica signal having a form that can be used to cancel out the noise signals that have been determined to be present in the original incoming analogue signal. This signal processing equipment, in this embodiment, is also controlled by the first component 22 via the third 'control' input 56.

The adjusted replica noise signal is then output to the second sub-component 36, where further adjustments are applied (if necessary) in order to match the adjusted replica noise signal as closely as possible to the incoming interfering noise. In particular, as can be seen from FIG. 6, the second sub-component 36 (labelled Function C in FIG. 3) of the 'counter-measure application' component comprises various elements of electronic circuitry, including fine phase adjusters 70, as well as multi-tap delay lines 72a, b. The fine phase adjusters 70 are used to adjust the phase of narrow-band noise signals (for example relatively narrow noise spikes), as the phase of these signals does not change over the frequency span of the signal. The delay lines 72a, b are used to apply the appropriate delay to wide-band signals for which the delay cannot be produced by simple phase-shifting since the phase of the signal will change over the frequency span of the signal. The second sub-component 36 also comprises one or more amplifiers (e.g. LNAs) 74 that are used to adjust the amplitude of the adjusted replica signals to match the amplitude of the incoming interfering noise signals. As with the first sub-component 34, the signal processing equipment in the second sub-component 36 may also be controlled by the first component 22, or alternatively by another separate component such as the baseband processor 6. A switch 76 is also provided, as well as a mixer 78 (it is noted that mixer 78 of FIG. 6 carries out the same function as mixer 25 of FIG. 2), to control the addition of the adjusted replica noise signals to the incoming analogue signal to form the modified analogue signal 23 that is passed to the analogue signal processing circuitry 4.

The second sub-component 36 further comprises one or more configurable signal filtering electronic circuitry components that are arranged to remove or cut out specifically-identified noise signals from the incoming analogue signal. Specifically, the second sub-component comprises one or more programmable narrow-band notch filters 80, which are configured using the digital matrix 48 of noise signals generated by the first component 22. These narrow band notch filters 80 are defined to have a centre frequency matching that of each identified noise signal that is to be cut out, and are usually used in situations where the interfering signal is deemed not to be suitable to be inverted and added into the incoming analogue signal. Such narrow band notch filters 80 have a much sharper performance over a narrow frequency band than existing wideband filters, thereby enabling the removal of interference without unduly affecting the shape or characteristics of the wanted wideband signal.

The second sub-component 36 also comprises a multi-tap delay line 72b where delays are applied to the incoming analogue signal where phase matching is required prior to mixing in the signals, generated by the first sub-component 34, using the mixer 78. This is only used where the phase match cannot be achieved from the first sub-component 24.

It will be appreciated that the nature of the interference signals may be such as to require constant adjustment of the filters 80 in real-time, for example where the sources and/or the level of noise varies rapidly over time. However, by using a third component 26 which assesses the performance of the noise reduction system 20 (by monitoring the modified analogue signal) and provides feedback to one or more of the other components 22, 24, the filtering process carried out by the notch filters 80 is dynamic and adaptive, and allows the system 20 to actively react to and compensate for variations in noise. In addition, as the results of the filtering and signal removal are monitored by the third component 26, once it is determined that the residual noise is at a suitable level to enable the digitised signal to be decoded fully without errors, the noise reduction process (for that particular signal or set of signals) can be considered to be complete and no further changes made until the incoming interference changes.

Disclosed embodiments use the ability of narrow bandwidth filters 80 to provide a much more controlled frequency range and bandwidth for targeted noise removal than existing band filters found in current mobile phone digital receivers. This is because existing band filters have a wide passband required for high bandwidth signals creating a much-reduced performance in terms of the ability to remove near-band or in-band interfering noise signals.

Figure 7:
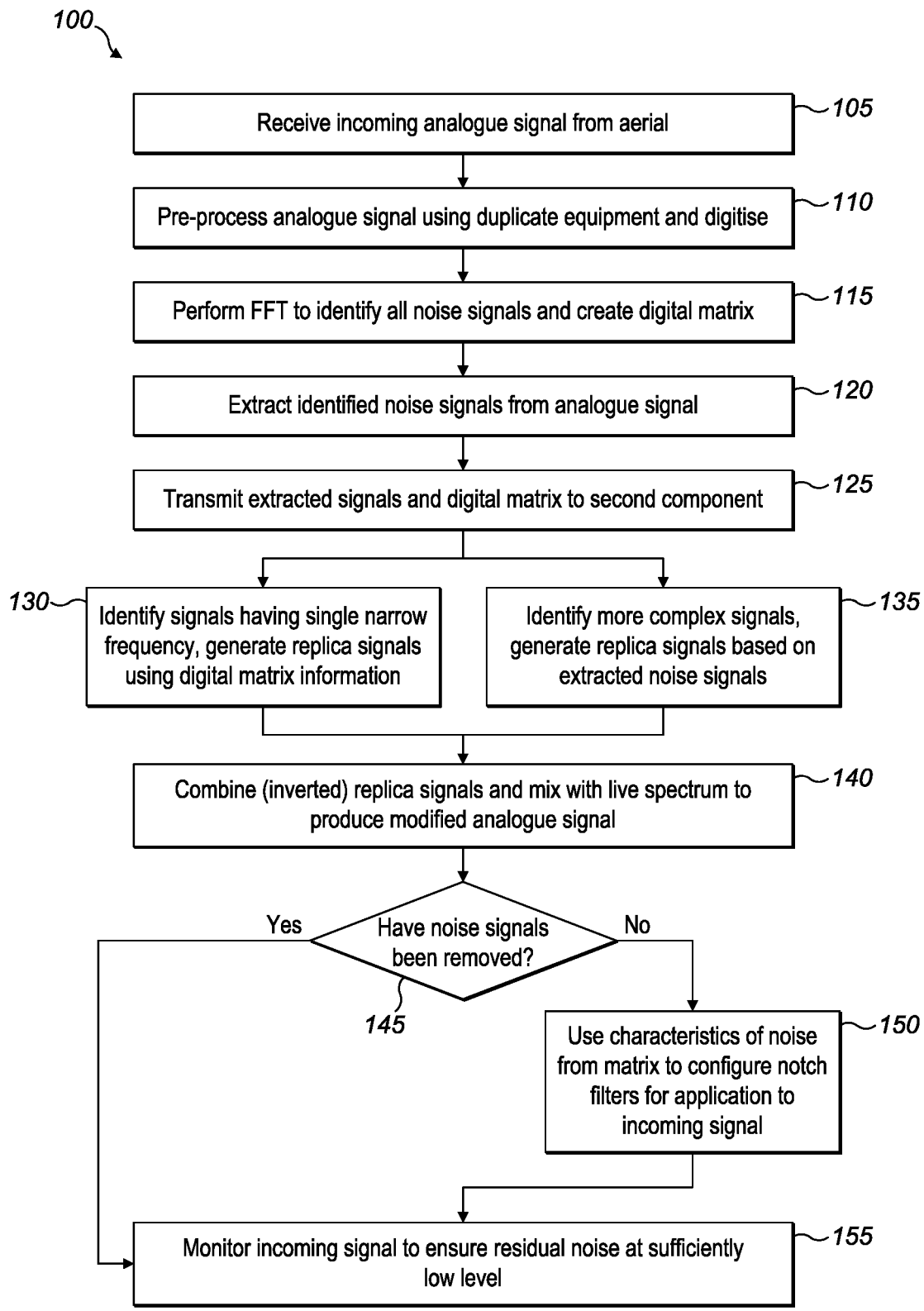
FIG. 7 is a flowchart showing the general method utilised by the noise reduction system of FIG. 2 to reduce the noise in a digital receiver.

An example of a method 100 used by the noise reduction system 20 according to a disclosed embodiment will now be described with reference to FIG. 7, and the effects of such a method are illustrated in FIGS. 8A-C.

The method 100 begins in Step 105 with receipt of the incoming analogue signal from the aerial 2 by the first ('signal assessment') component 22 in the noise reduction system 20. The first component 22 comprises a duplicate set of band filters and other pre-processing equipment 8, 10, 12, 14 that are present in the existing analogue signal processing circuitry 4, and is programmed with data regarding the wanted signal—for example, the channel (frequency) of the wanted signal is known from the baseband processor. The first component 22 is therefore able to carry out pre-processing and digitisation of the analogue signal in Step 110 to generate an equivalent digital signal to that which would be produced by the mobile phone analogue signal processing circuitry 4.

The first component 22 is then configured to carry out a rapid FFT 46 in Step 115 on the digitised signal (which will require only a few clock cycles of time or instruction cycles—for example, up to a minimum of a few picoseconds) in order to identify all of the individual components that are comprised in the signal—this includes both the wanted signal as well as all other interfering noise signals that are also present within the passband of the filters. Such interfering noise signals may have centre frequencies that are out of the band of interest for the wanted signal, but the signal spectrum may still encroach on the passband of the wanted signal. In this case, the FFT will merely flag (side lobe) frequencies of the noise which encroach on the frequency band of interest. A digital matrix 48 of all of the identified interfering noise signals is created by the first component 22, where each signal is characterised by its associated frequency and size (i.e. amplitude); optionally, other characteristics of the signals such as their width (i.e. spectrum spread) and modulation may also be included in the generated matrix. Based on this identification of all the interfering noise signals, the first component 22 configures a set of passband filters of appropriate width and frequency to extract in Step 120 each of the interfering noise signals from the received analogue signal.

The digital matrix 48 that characterises each of the signals, together with the extracted noise signals 32 if appropriate, are then transmitted in Step 125 to the second ('counter-measure application') component 24, where the most appropriate noise removal technique is applied for each of the identified noise signals. In some instances, the first component 22 determines the most appropriate noise removal counter-measure to be taken, as the necessary information is contained within the digital matrix 48 generated by the first component 22 during the FFT 46; however, in some instances, the second component 24 may carry out the determination based on the digital matrix 48 received from the first component 22. The exact implementation method that is utilised will depend on the device and system in which the noise reduction system 20 is used (and may, for example, depend on the spare processing capacity). Alternatively, all or part of the noise reduction system 20 may be controlled by the baseband processor 6.

For signals having a single narrow frequency, the second ('counter-measure application') component 24 will first attempt to remove in Step 130 the signal via the generation of a replica signal by the first sub-component 34 (corresponding to Function B in the figures) using its internal electronic circuitry. This is carried out via the first signal processing path that was previously described with reference to FIG. 5. Specifically, the first sub-component 34 of the 'counter-measure application' component may generate a sine wave type signal (also sometimes referred to as a tonal signal) of the same frequency as the noise signal in question. As previously described, the DAC 58 and VCO 60 combination in that sub-component 34 perform this function based on the information obtained from the digital matrix 48, and optionally under the control of the first component 22. Additionally or alternatively, for signals that are more complex, the first sub-component 34 may utilise in Step 135 the second signal processing path to produce a replica signal based on the analogue noise signals 32 that were received from the first component 22. As was discussed previously, the signals produced by the two signal processing paths may then be mixed to produce a combined replica signal. The resultant replica signal will then be passed through an adaptive LMS filter and fine phase adjuster 62 to create an adjusted replica signal that is substantially in anti-phase with the originally-identified interfering signal. This adjusted replica signal is then mixed in Step 140 with the 'live spectrum'—i.e. the incoming analogue signal by the second sub-component 36 to form a modified analogue signal 23—before it enters the existing analogue signal processing circuitry 4. As noted previously, the second sub-component 36 may apply further adjustments to the adjusted replica signal if necessary in order to bring the signal closer into anti-phase with the incoming signal.

The third component 26, which comprises almost identical circuitry to the first component 22, constantly monitors the modified analogue signal 23 immediately after output from the second component, and is able to establish in Step 145 in real-time if the technique that has been applied has resulted in the interfering signal being successfully cancelled out, or reduced to an acceptable level. Specifically, the third component 26 is effectively a duplicate of the first component 22, and also acts under the control of the first component 22; the third component 26 therefore also digitises the input signal (comprising a mixture of the original signal and the generated adjusted replica signal) and performs a Fast FFT 46 of the digitised signal to generate a digital matrix 48 of the noise present in the modified analogue signal 23. The FFTs from the first 22 and third 26 components can then be compared to determine whether the signal(s) in question have been removed adequately. Alternatively, an analysis of the FFT result from the third component 26 could be carried out on its own to identify the presence of residual noise signals.

If some residual interference from these signals is still determined to be present in the modified analogue signal 23, then the next technique is applied in Step 150, namely to dynamically configure and apply a very narrow notch filter 80 at the centre frequency of each interfering signal that is to be removed. This technique is carried out by the second sub-component 36. The centre frequency of the notch filter 80 can be moved to avoid any accidental distortion of the wanted signal, and therefore may not necessarily coincide exactly with the centre frequency of the interfering signal that is to be removed. However, such offsets should not result in a detrimental effect on the efficacy of the noise removal.

For wide signals with complex modulation, the process of generating a replica signal based on a simple tonal signal may not be appropriate. In such cases, the signal characteristics contained within the digital matrix 48 produced by the first component 22 are used by the second component 24 to define filter characteristics of one or more configurable notch filters 80 that will be used to perform removal of the interfering signal. As discussed above, the centre frequency of the notch filter may potentially be slightly offset from the centre frequency of the interfering signal to avoid any accidental distortion of the wanted signal during removal of the interfering signal.

As with the previously-described technique for narrow signals, the third component 26 will monitor in Step 155 the modified incoming analogue signal 23 in order to ascertain whether the noise removal techniques have been applied correctly and the extent of their success. This feedback and monitoring process enables the noise removal techniques to be altered in real-time so as to provide optimum and targeted noise reduction.

For general in-band noise, a combination of both the above techniques will generally be utilised, although it will be appreciated that the noise removal techniques described herein can be applied in different orders, or even at the same time. For example, in some instances, it may be preferable for the notch filter signal removal technique to be applied first, followed by the signal replication removal technique to remove any residual noise signals.

In at least one embodiment, it is envisioned that the notch filters 80 will first be tuned to remove all noise signals except the spectrum of the wanted signal (for example, in some cases this can remove up to 90% of the interfering signals); the remaining noise is subsequently reduced by mixing an antiphase-adjusted replica/copy of the delayed incoming analogue signals (generated using one or both of the signal processing paths within the second component 24). This combination of techniques cancels out a large proportion, if not all, of the noise and reduces the interference to a much lower (acceptable) level. In addition, it is also envisioned that in at least one embodiment, implementation of the signal replication technique may involve first mixing the inverted and adjusted replica analogue noise signals generated using the second signal processing path, followed by mixing inverted tonal signals generated using the first signal processing path. It will be appreciated that the order in which the noise removal counter-measure techniques are applied may be governed by a set of logic rules that are stored by the first 22 and/or second 24 component in the noise reduction system 20.

By eliminating the surrounding signals and background noise currently present in the existing circuitry, the existing analogue signal processing circuitry 4 of the mobile phone will be able to amplify the wanted signal sufficiently to enable demodulation to occur without errors. The removal of errors will enable the system bandwidth to be entirely utilised for the transfer of data, without wasting any bandwidth on resending or correcting data decoded with errors.

FIGS. 8A to 8C highlight the beneficial effects that the noise reduction system described herein can have on existing signals.

FIG. 8A shows the frequency spectrum 200 of an example wanted signal in the scenario where an adjacent interfering signal 205 is also present in the selected passband. As previously mentioned, there is a need to increase the SNR of the digital signal that is to be decoded, so as to ensure that the SNR is sufficiently high to allow decoding of the digital information contained within the signal. However, the presence of the unwanted (interfering) noise signal 205 will result in a reduction in amplification of the wanted signal 200, so as to prevent the amplified unwanted signal from exceeding the system's capabilities. The wanted signal 200 will therefore suffer significant degradation due to the presence of the adjacent noise signals 205, and therefore the resultant decoding (bit rate) errors will be much greater. This can be visualised in the constellation diagram of FIG. 8B, in which a large scatter in each of the four groups of points 210 in the diagram, corresponding to high bit rate errors, can be seen.

By contrast, FIG. 8C shows a constellation diagram of the bit rate errors when decoding the same signal that was shown in FIG. 8A after it has been acted upon by the noise reduction system 20 described herein. As can be clearly seen, the extent of scatter is greatly decreased, and the points in each of the four groups 215 are grouped together much more densely—it can therefore be ascertained (for example via measurements) that the bit rate errors have been significantly reduced.

Specifically, the decrease in bit rate errors indicated in FIG. 8C was achieved by the applicant during a set of real-world tests using the noise reduction system 20 described herein, which improved the recovered signal strength by 54 dBM. Other tests performed on real mobile 4G TLE signals produced a 63 dBM improvement in the received signal. Therefore, as bit rate errors reduce proportionally to received signal increases, improved signal strengths will be perceived by the mobile phone receivers, and the mobile network will be able to provide higher data rate transfers, as bandwidth will not be used up resending or correcting data decoded with errors.

Figure 9:
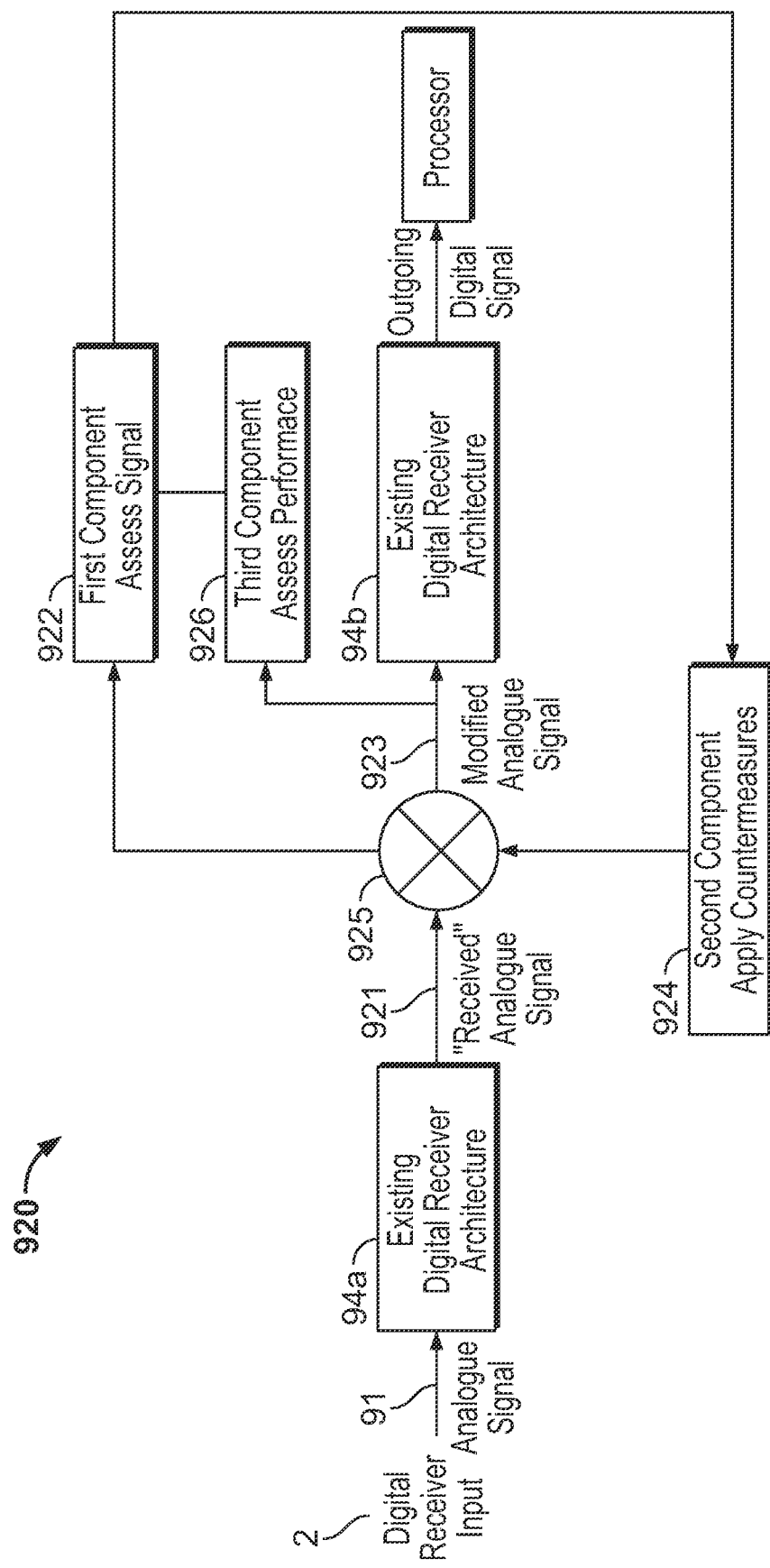
FIG. 9 is a schematic block diagram showing components of a noise reduction system for reducing noise in a digital receiver, according to a further disclosed embodiment.

FIG. 9 provides a high-level illustration of a noise reduction system 920, according to a further disclosed embodiment. It is noted that the FIG. 9 illustration of the noise reduction system 920 is similar to the noise reduction system 20 shown in FIG. 2.

The noise reduction system 920 of this further embodiment may also be integrated into existing mobile phone system architecture. As described above, the noise reduction system 20 is designed to act on incoming analogue signals 21 before they are processed by the analogue signal processing circuitry 4 and then converted into digital signals. The noise reduction system 920 also acts on received analogue signals before they are converted into digital signals but, in the noise reduction system 920 some analogue signal processing occurs before the noise reduction system 920 receives an incoming analogue signal.

As shown in FIG. 9 therefore the existing analogue circuitry is split into two portions, 94a and 94b. An analogue signal 91 is received at a digital receiver input (e.g. a mobile device aerial 2) and is passed to analogue circuitry 94a where some initial analogue processing occurs. The analogue signal 921 leaving circuitry 94a is then received, as the "received analogue signal 921", at the noise reduction system 920.

In a similar manner to the noise reduction system in FIG. 2, the noise reduction system 920 comprises three components or functional blocks which each carry out a different type of task. A first 'signal assessment' component 922 is configured to analyse or assess the received analogue signal 921 and to identify the various sources of noise present within the received signal; and a second 'counter-measure application' component 924 is configured to use various electronic circuitry elements (for example, filters, mixers, amplifiers, switches etc.) to take one or more of a plurality of counter-measures in order to reduce or eliminate the identified sources of noise. This may involve incorporating additional signals into the incoming analogue signal via a mixer 925 such that a "modified analogue signal" 923 is passed to the analogue processing circuitry 94b. A third 'performance assessment' component 926 is configured to assess the performance of the noise reduction system 920 by analysing the modified analogue signal 923 (in other words analysing the received analogue signal 921 after it has been acted upon by the second component 924), and identifying sources of noise still present within the analogue signal in order to ascertain whether any further or additional counter-measures need to be taken by the second component 924.

In addition to carrying out the initial noise level assessment of the received analogue signal 921, the first component 922 is also arranged to have overall control over the functioning of the noise reduction system 920 as a whole. In particular, the first component 922 is arranged to control the types of counter-measures that are taken by the second component 924, as well as to control the manner in which the third component 926 assesses the overall noise reduction system 920 performance. However, it will be appreciated that this setup is merely one of several possible configurations—for example, other components such as the baseband processor 6 may have control over all or part of the noise reduction system 920.

As a result of its location within the existing mobile phone system architecture and configuration, the noise reduction system 920 is able to remove or mitigate the interfering noise signals from the incoming signal before it enters the digital signal circuitry, e.g. before it enters the digital signal processor 6. This directly improves the SNR of the analogue signal that is processed and digitised, and removes or reduces errors in the subsequent decoding of the digital signals. This enables much higher data rates to be achieved (due to the reduction in errors) and hence a given communications channel can support higher bandwidths over much greater distances.

As shown in FIG. 2 the noise reduction system 20 receives the incoming analogue signal 21 from the digital receiver input 2 and reduces or mitigates the effects of noise before outputting the modified analogue signal 23 to the analogue processing circuitry 4. FIG. 9 shows a further embodiment in which some analogue signal processing occurs prior to the noise reduction system 920.

In both FIGS. 2 and 9 the digital receiver that the noise reduction system is incorporated into comprises a digital receiver input, an analogue portion (the analogue signal processing circuitry 4 in FIG. 2/the analogue signal processing circuitry 94a and 94b in FIG. 9) and a digital portion (the baseband processor 6 shown in FIG. 2/the baseband processor 96 shown in FIG. 9).

The further embodiment of FIG. 9 is provided to show that the noise reduction system 920 may be located at other locations within the analogue portion and need not necessarily be located directly after the digital receiver input as shown in FIG. 2. FIG. 9 therefore effectively comprises a generalised embodiment of the arrangement shown in FIG. 2 and as shown in FIG. 9 the noise reduction system 920 (regardless of its location within the analogue portion) operates to receive an analogue signal 921 and to output a modified analogue signal 923 in which the noise present within the received analogue signal 921 has been removed or reduced. [It is noted that the received analogue signal 921 is a signal that comprises the wanted signal (i.e. the modulated analogue signal that contains the data to be decoded) and noisy/interfering signals. It can be seen therefore that the noise reduction system according to a disclosed embodiment operates to receive the incoming analogue signal and then to reduce or mitigate the effects of noise within the received analogue signal in order to output a modified analogue signal 923 that comprises the wanted signal and fewer noisy/interfering signals (compared to the received analogue signal).]

Although the noise reduction system 920 in FIG. 9 effectively splits the existing analogue processing circuitry it is to be appreciated that the noise reduction system 920 could be located next to the digital receiver input (as in FIG. 2), located as per FIG. 9 such that the analogue signal processing circuitry is split or located between the analogue portion and the digital portion.

Figure 10:
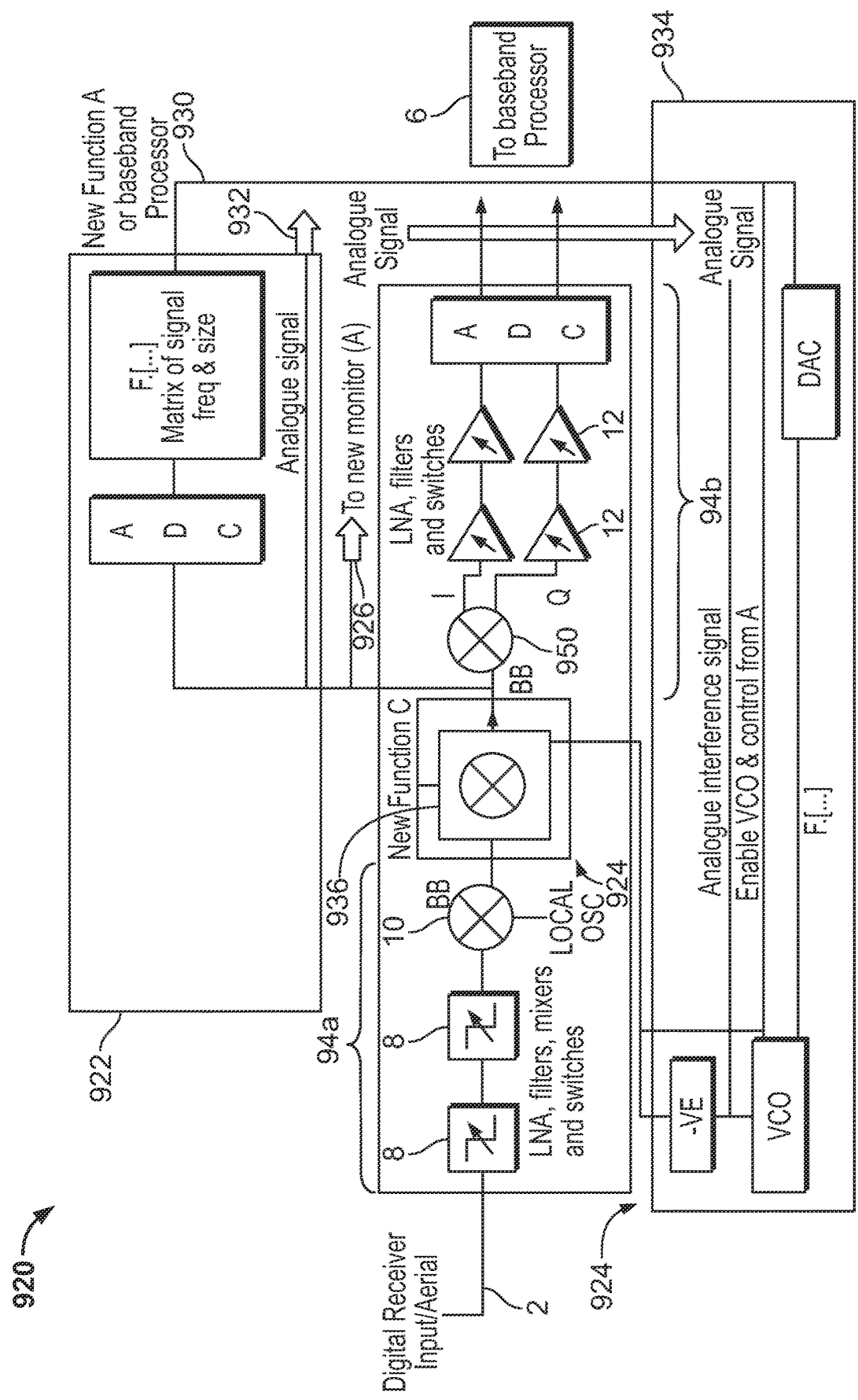
FIG. 10 is a schematic block diagram showing a more detailed illustration of the components of the noise reduction system of FIG. 9, where the noise reduction system is incorporated into a typical mobile phone system architecture.

FIG. 10 shows in greater detail the configuration of the noise reduction system 920 that was broadly described in FIG. 9. In particular, FIG. 10 shows the location of the various components of the noise reduction system relative to the existing receiver architecture (as shown in FIG. 1) and the existing signal processing paths. It is noted that the functionality of the first component 922, second component 924 and third component 926 is the same as the equivalent components (22, 24, 26 respectively) in FIG. 2 and corresponding features within the three components have been labelled in a similar way, e.g. the first component 922 comprises two outputs 930, 932 which correspond to the outputs 30, 32 in FIG. 2, the second 'counter-measure application' component 924 of the noise reduction system 920 comprises two sub-components 934, 936 which correspond to sub-components 34, 36 in FIG. 2 etc. In particular, in a similar way to sub-component 36, it is noted that sub-component 936 may comprise various electronic circuitry such as one or more of: notch filters (e.g. notch filters 80), fine phase adjusters (e.g. fine phase adjusters 70), multi-tap delay lines (e.g. lines 72a, b), one or more amplifiers (e.g. LNAs).

There are some differences to the first component 922 as noted below but the functionality provided by these three components in FIG. 9 is otherwise the same as the equivalent components in FIG. 2.

The differences between the FIG. 2 and FIG. 9 embodiments may be seen by comparing the more detailed FIGS. 3 and 4 with FIG. 10.

As shown in FIGS. 3 and 4, the first component 22 comprises pre-processing equipment (e.g. bandpass filters 8, mixers 10 as well as amplifiers 12 ((for example, LNAs, or Low Noise Amplifiers) and mixers 10—which replicates the existing analogue signal processing circuitry 4. The analogue signal 21 that is received from the digital receiver input 2 is effectively split by the mixer element 25 such that the first component 22 can operate in parallel to the analogue signal processing circuitry 4.

In FIG. 10 however it can be seen that the analogue signal is only replicated after the analogue signal processing circuitry 94a (which contains bandpass filters, mixers and other components). As such, the first component 922 is able to omit the bandpass filters 8, mixers 10 etc compared to the equivalent component 22 in FIGS. 3 and 4.

In all other regards however the operation of the first component 922 is the same as the operation of the first component 22 as described in FIGS. 3 and 4. Additionally, the operation of the second component 924 is the same as the operation of the second component 24 in FIGS. 3, 5 and 6. The operation of the third component 926 is the same as the operation of the third component 26 as described above.

Turning now to the second sub-component 936 shown in FIG. 10, it can be seen that this sub-component 936 receives the "received analogue signal 921" from the mixer 10. The mixer 10 receives a signal from a local oscillator and so the output of the mixer 10 (which forms the received analogue signal 921 that is input into sub-component 936) is down converted to the baseband frequency of the digital receiver. The baseband frequency is lower than the frequencies used in mobile phone bands (e.g. USA 2G/3G at 1900 MHz, 4G LTE 5200 MHz and 5G NR 39,000 MHz) and so the particular embodiment shown in FIG. 10 has the benefit that the frequencies that the noise reduction system 920 is operating at are less demanding. It is also noted that the noise reduction system will operate at the baseband frequency regardless of the actual mobile phone band used which in turn means that no knowledge of the communication frequency of the digital receiver is required by the noise reduction system.

The components of the noise reduction system in the FIG. 9/10 embodiment will in practice often be centred on a zero intermediate frequency (IF) frequency. However, an IF or baseband frequency signal anywhere in the spectrum can be used if desired.

It will be understood by those familiar with software defined radio (SDR) and RF receiver circuits that the mixer 10 has a local oscillator or similar circuit to produce an IF or baseband signal frequency. These components have not been shown in the attached Figures for the sake of clarity but will be familiar to a person skilled in the art of RF circuits.

As shown in FIG. 9 a mixer 950 has "split" the IF or baseband signal into I and Q signals. This process can be either before or after the noise reduction system 920 depending on the preferences of the implementation.

The operation of the components 922, 924, 926 is otherwise the same as for the three components 22, 24, 26 provided with reference to FIGS. 4 to 6 above.

Many other advantages are also achieved via the use of the present noise reduction system 20. For example, power to the RF sections of a mobile phone can be reduced as the received signal strength is sufficient, thereby extending the overall battery life of the mobile phone. Furthermore, fewer cell towers will be required to cover a given area.

Many modifications may be made to the above examples without departing from the scope of disclosed embodiments as defined in the accompanying claims. In particular, it will be appreciated that the techniques described herein could be applied in all of the existing mobile network standards. For example, in mobile networks, such techniques would be compliant with current 3G and 4G standards, as well as proposed 5G standards.

Furthermore, as was previously discussed, the applications of the present noise reduction system 20 (920) are diverse, and are not limited to mobile phones or other similar devices. For example, use of the present noise reduction system 20 recovers the signal losses down a given cable or fibre for broadband cable connections, and can thereby result in the extension of broadband signals. Similarly, Wi-Fi signal coverage can also be significantly extended through use of the noise reduction system. Space (satellite-based) communications can also be achieved over larger distances, or at a reduced power.

The invention claimed is:

1. A noise reduction system for a digital receiver for reducing noise in signals received at the digital receiver, wherein the digital receiver includes a digital receiver input for receiving an analogue signal, analogue signal processing circuitry for processing the received analogue signal, and an output for providing the processed signal to a digital signal processor, wherein the noise reduction system is configured to reduce noise in the received analogue signal after receipt of the analogue signal at the digital receiver input and before the received analogue signal enters the digital signal processor, wherein the noise reduction system comprises:
    a first component comprising:
    an input arranged to receive the analogue signal;
    a processor arranged to assess the received analogue signal and to identify one or more noise signals within the received analogue signal; and
    an output arranged to output the results of the noise signal identification; and
    a second component comprising:
    an input arranged to receive the results of the noise signal identification from the first component; and
    electronic circuitry arranged, in dependence on the results of the noise signal identification, to apply one or more counter-measures to the received analogue signal to produce a modified analogue signal, the modified analogue signal having a reduced level of noise compared to the received analogue signal,
    wherein the noise reduction system is arranged to assess the effectiveness of the one or more counter-measures applied by the second component to determine whether any further counter-measures are required, and
    wherein the electronic circuitry of the second component is configured to generate a replica noise signal corresponding to one of the identified noise signals, to adjust the replica noise signal so that it is substantially in anti-phase with the identified noise signal and to mix the adjusted replica noise signal with the incoming analogue signal to produce the modified analogue signal.

2. The noise reduction system of claim 1, wherein the processor of the first component is configured to convert the received analogue signal into a digital signal, and to perform a mathematical transformation on the converted digital signal, the mathematical transformation identifying the one or more noise signals and at least one property associated with each identified noise signal.

3. The system of claim 2, wherein the output of the first component is configured to output the results of the mathematical transformation to the second component.

4. The system of claim 2, wherein the at least one property associated with each identified noise signal is selected from the following group: central frequency of the signal, signal amplitude, signal width, and signal modulation.

5. The system of claim 1, wherein the processor of the first component is arranged to extract each of the one or more identified noise signals from the incoming analogue signal, and the output of the first component is arranged to output the extracted analogue noise signals to the second component.

6. The system of claim 1, wherein one of the counter-measures applied by the electronic circuitry of the second component comprises configuring and applying a filter to the incoming analogue signal to remove one of the identified noise signals.

7. The system of claim 1, wherein the replica noise signal is generated based on the generation of a tonal signal.

8. The system of claim 1, wherein the processor of the first component is arranged to output a control signal to the second component to control the counter-measures that are applied by the electronic circuitry second component.

9. The system of claim 1, wherein the processor of the first component is arranged to assess the effectiveness of the one or more counter-measures applied by the second component.

10. The system of claim 1, wherein the output of the first component is arranged to output a control signal to a third component to control an effectiveness assessment carried out by the third component.

11. The system of claim 10, wherein the third component is arranged to be controlled via output of a control signal from the digital signal processor to the respective component.

12. The system of claim 1, wherein at least one of the first and second components is arranged to be controlled via output of a control signal from the digital signal processor to the respective component.

13. The system of claim 1, wherein the digital receiver comprises a digital receiver in a mobile device, wherein the input comprises a mobile device aerial and the digital signal processor comprises a baseband processor of the mobile device.

14. The system of claim 1, wherein the incoming analogue signal comprises any one of the following: mobile network signals, radio signals, Wi-Fi signals, satellite communications, broadband connections.

15. A mobile device comprising the noise reduction system of claim 1.

16. A WiFi router comprising the noise reduction system of claim 1.

17. A noise reduction method for reducing noise in signals received at a digital receiver, the digital receiver includes a digital receiver input for receiving an analogue signal, analogue signal processing circuitry for processing the received analogue signal, and an output for providing the processed signal to a digital signal processor, wherein the method is configured to reduce noise in the received analogue signal after receipt of the analogue signal at the digital receiver input and before the received analogue signal enters the digital signal processor and the method comprises:
    assessing, by a processor of a first component, the received analogue signal and identifying one or more noise signals within the analogue signal;
    applying, by electronic circuitry of a second component, one or more counter-measures to the received analogue signal in dependence on the identified noise signals in order to produce a modified analogue signal, the modified analogue signal having a reduced level of noise compared to the received analogue signal;
    assessing the effectiveness of the one or more applied counter-measures to determine whether any further counter-measures are required; and
    generating, by the electronic circuitry of the second component, a replica noise signal corresponding to one of the identified noise signals, to adjust the replica noise signal so that it is substantially in anti-phase with the identified noise signal and mixing the adjusted replica noise signal with the incoming analogue signal to produce the modified analogue signal.

18. A non-transitory computer-readable storage medium comprising computer program instructions which, when executed by a computer, cause the computer to carry out operations to perform the method of claim 17.

* * * * *